(12) United States Patent
Peng et al.

(10) Patent No.: US 8,519,430 B2
(45) Date of Patent: Aug. 27, 2013

(54) OPTOELECTRONIC DEVICE AND METHOD FOR MANUFACTURING THE SAME

(75) Inventors: Wei-Chih Peng, Hsinchu (TW);
Min-Hsun Hsieh, Hsinchu (TW);
Ming-Chi Hsu, Hsinchu (TW); Wei-Yu Yen, Hsinchu (TW); Chun-Kai Wang, Hsinchu (TW); Yen-Chih Chen, Hsinchu (TW); Schang-Jing Hon, Hsinchu (TW); Hsin-Ying Wang, Hsinchu (TW); Chien-Kai Chung, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 73 days.

(21) Appl. No.: 13/225,117

(22) Filed: Sep. 2, 2011

(65) Prior Publication Data
US 2012/0104455 A1    May 3, 2012

(30) Foreign Application Priority Data

Oct. 29, 2010 (TW) .................................. 99137445 A
Jan. 19, 2011 (TW) .............................. 100102057 A

(51) Int. Cl.
*H01L 33/00*    (2010.01)

(52) U.S. Cl.
USPC 257/103; 257/79; 257/E33.068; 257/E33.008; 438/47

(58) Field of Classification Search
USPC ................... 438/29, 46, 47; 257/98, 79, 103, 257/E33.068, E33.008
See application file for complete search history.

(56) References Cited

U.S. PATENT DOCUMENTS 6,859,477 B2 *    2/2005    Deppe et al. ............... 372/45.01

* cited by examiner

*Primary Examiner* — David Vu
(74) *Attorney, Agent, or Firm* — Muncy, Geissler, Olds & Lowe, PLLC

(57) ABSTRACT

An optoelectronic device includes a substrate and a first transition stack formed on the substrate including at least a first transition layer formed on the substrate and having at least one hollow component formed inside the first transition layer, and a second transition layer wherein the second transition layer is an unintentional doped layer or an undoped layer formed on the first transition layer.

20 Claims, 13 Drawing Sheets

OPTOELECTRONIC DEVICE AND METHOD FOR MANUFACTURING THE SAME

RELATED APPLICATION

This application claims the priority to and the benefit of TW application Ser. No. 099137445 filed on Oct. 29, 2010 and TW application Ser. No. 100102057 filed on Jan. 19, 2011. This application is a continuation-in-part of U.S. patent application, Ser. No. 13/178,323, entitled "OPTOELECTRONIC DEVICE AND METHOD FOR MANUFACTURING THE SAME", filed on Jul. 7, 2011, now U.S. Pat. No. 8,344,409, wherein the contents of which are incorporated herein by reference in their entirety.

BACKGROUND

1. Technical Field

The present disclosure relates to an optoelectronic device having a transition stack formed between the semiconductor layer and the substrate.

2. Description of the Related Art

The light radiation theory of light emitting diode (LED) is to generate light from the energy released by the electron moving between the n-type semiconductor and the p-type semiconductor. Because the light radiation theory of LED is different from the incandescent light which heats the filament, the LED is called a "cold" light source. Moreover, the LED is more sustainable, longevous, light and handy, and less power consumption, therefore it is considered as a new light source for the illumination markets. The LED applies to various applications like the traffic signal, backlight module, street light, and medical instruments, and is gradually replacing the traditional lighting sources.

Generally, the light extraction efficiency depends on the internal quantum efficiency and light extraction efficiency. The internal quantum efficiency can be defined as the optoelectrical conversion efficiency in the LED.

FIG. 5A illustrates the structure of a conventional light emitting device 10 which includes a transparent substrate 10, a buffer layer 11, a semiconductor stack layer 12 formed above the transparent substrate 10, and an electrode 14 formed above the semiconductor stack layer 12, wherein the semiconductor stack layer 12 comprises, from the top, a first conductive-type semiconductor layer 120, an active layer 122, and a second conductive-type semiconductor layer 124. At least one void 111 is formed inside the buffer layer 11.

However, as shown in the FIG. 5B, the conventional light emitting device 100 has a gray surface because of the void 111 inside the buffer layer 11, and the light transmission is decreased.

SUMMARY OF THE DISCLOSURE

An optoelectronic device includes a substrate and a first transition stack formed on the substrate including at least a first transition layer formed on the substrate and having at least a hollow component formed inside the first transition layer, and a second transition layer wherein the second transition layer is an unintentional doped layer or an undoped layer formed on the first transition layer.

BRIEF DESCRIPTION OF DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE PREFERRED EMBODIMENTS

Figure 1A:
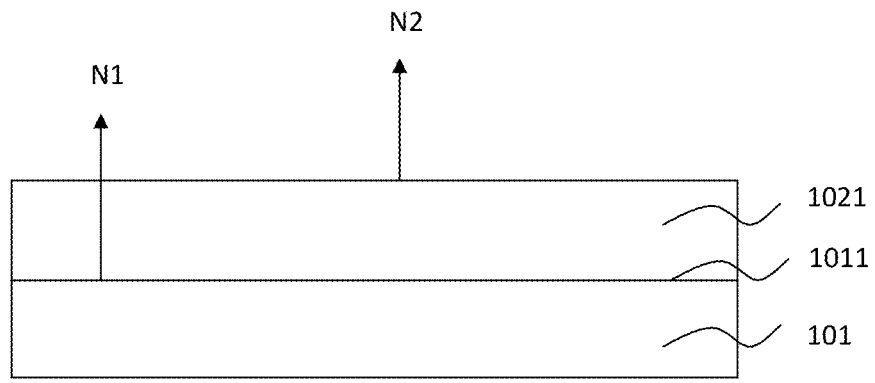
FIGS. 1A-1B and 1D-1G illustrate a process flow of a method of fabricating an optoelectronic device of the first embodiment in the present disclosure.

Reference is made in detail to the preferred embodiments of the present application, examples of which are illustrated in the accompanying drawings. Wherever possible, the same reference numbers are used in the drawings and the description to refer to the same or like parts.

The present disclosure describes an optoelectronic device and a method of fabricating the optoelectronic device. In order to have a thorough understanding of the present disclosure, please refer to the following description and the illustrations.

FIGS. 1A to 1F illustrate a process flow of the method of fabricating the optoelectronic device of first embodiment of the present disclosure. FIG. 1A shows a substrate 101 having a normal direction N1 and a first major surface 1011. A first transition layer 1021 is formed on the first surface 1011 of the substrate 101 and has a normal direction N2 wherein the thickness of the first transition layer 1021 can be 0.3-3 μm, 0.4-3 μm, 0.5-3 μm, 0.7-3 μm, 1-3 μm, or 2-3 μm.

In this embodiment, the material of the first transition layer 1021 contains at least one element selected from the group consisting of Al, Ga, In, As, P, and N, such as GaN or AlGaInP. In one embodiment, the first transition layer 1021 can be an n-type doped layer; the doping concentration can be 1E15-1E19 $cm^{-3}$, 1E16-1E19 $cm^{-3}$, 1E17-1E19 $cm^{-3}$, 1E18-1E19 $cm^{-3}$, 5×1E18-1E19 $cm^{-3}$, 5×1E17-1E19 $cm^{-3}$, or 5×1E17-1E18 $cm^{-3}$.

Figure 1B:
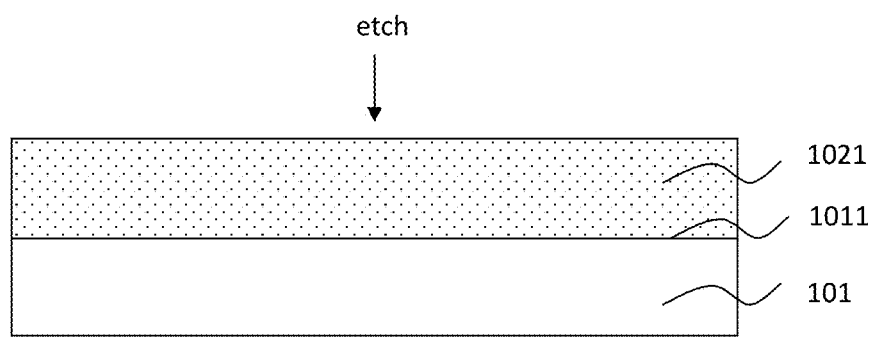

Following, as FIG. 1B shows, the first transition layer 1021 can be etched by the following method to form at least one hollow component such as pore, void, bore, pinhole, cavity, or at least two hollow components that can link into a mesh or porous structure.

The methods include: 1) Wet etching with an aqueous solution of at least one of $H_2SO_4$, $H_3PO_4$, $H_2C_2O_4$, HCl, KOH, and NaOH, ethylene glycol solution, or their mixture;

2) Electrochemical etching with an aqueous solution of at least one of $H_2SO_4$, $H_3PO_4$, $H_2C_2O_4$, HCl, KOH, and NaOH, an ethylene glycol solution, or their mixture; or 3) Dry etching such as inductive coupling plasma (ICP), reactive ion etch (RIE) by a gas containing at least one of HCl, $Cl_2$, $SF_6$, $H_2$, $BCl_3$, and $CH_4$.

Figure 1C:
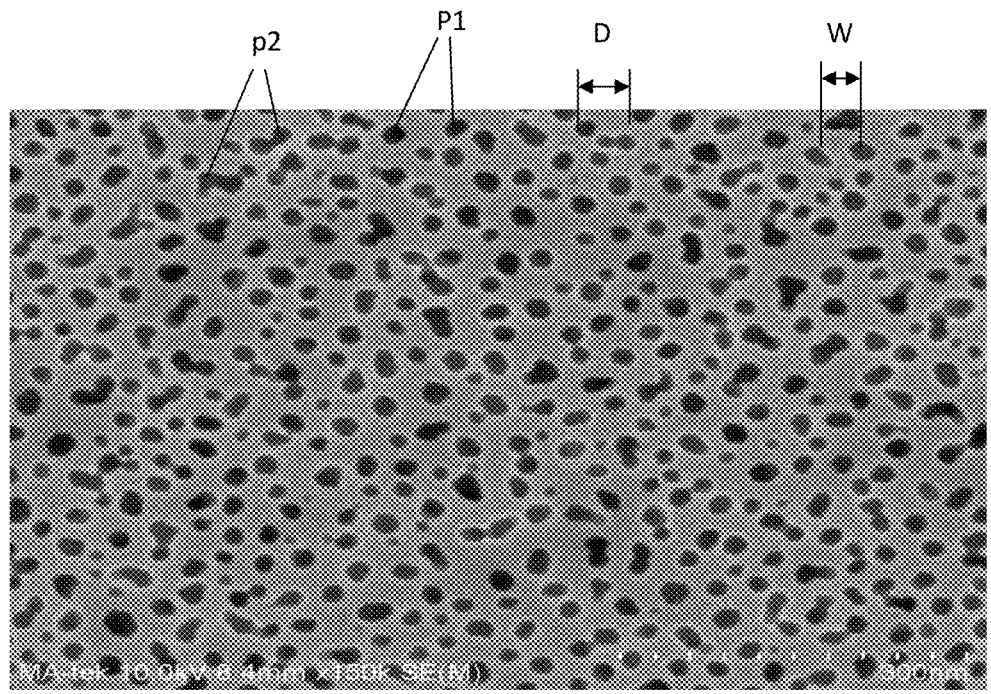
FIGS. 1C and 1H illustrate scanning electron microscope (SEM) pictures of the first embodiment in the present disclosure.

FIG. 1C illustrates a scanning electron microscope (SEM) picture of the first embodiment of the present disclosure which shows the top view of the first transition layer 1021. The first transition layer 1021 has a plurality of hollow components p1 or a plurality of mesh or porous structures p2 formed inside the first transition layer 1021 wherein the plurality of hollow components p1 can have the same or different width W.

In this embodiment, the width W of the hollow component is defined as the largest size of the hollow component p1 perpendicular to the normal direction N2 of the first transition layer 1021. The width W of the hollow component p1 inside the first transition layer 1021 can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm. In one embodiment, the width W of the hollow component p1 close to the substrate is larger than the width of the hollow component p1 close to the second transition layer 1022.

The average distance D between any two of the hollow components p1 can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm.

In another embodiment, the plurality of hollow components p1 inside the first transition layer 1021 forms a regular array structure. The average width W of the plurality of hollow components p1 can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm.

The porosity $\phi$ of the plurality of the hollow components p1 is defined as the total volume of the hollow components $V_V$ divided by the overall volume $V_T$ of the first transition layer 1021

$$\left(\phi = \frac{V_V}{V_T}\right).$$

In this embodiment, the porosity $\phi$ can be 5%-90%, 10%-90%, 20%-90%, 30%-90%, 40%-90%, 50%-90%, 60%-90%, 70%-90% or 80%-90%.

Figure 1D:
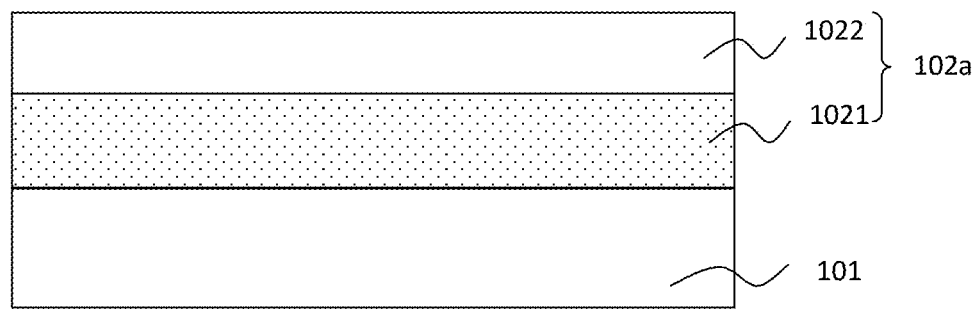

Following, as FIG. 1D shows, a second transition layer 1022 is formed on the first transition layer 1021 wherein the first transition layer 1021 and the second transition layer 1022 form a first transition stack 102a. The growing temperature of the second transition layer 1022 can be 800-1200° C., and the pressure can be 100-700 mbar, wherein the adjustment of the growing condition is based on the porosity and volume of the hollow component of the first transition layer 1021. The second transition layer 1022 is laterally grown and coalesced on the first transition layer 1021 by decreasing the volume of the hollow component between the interface of the first transition layer 1021 and the second transition layer 1022 and continues to grow vertically. In one embodiment, the second transition layer 1022 is an unintentional doped layer or an undoped layer.

Figure 1E:
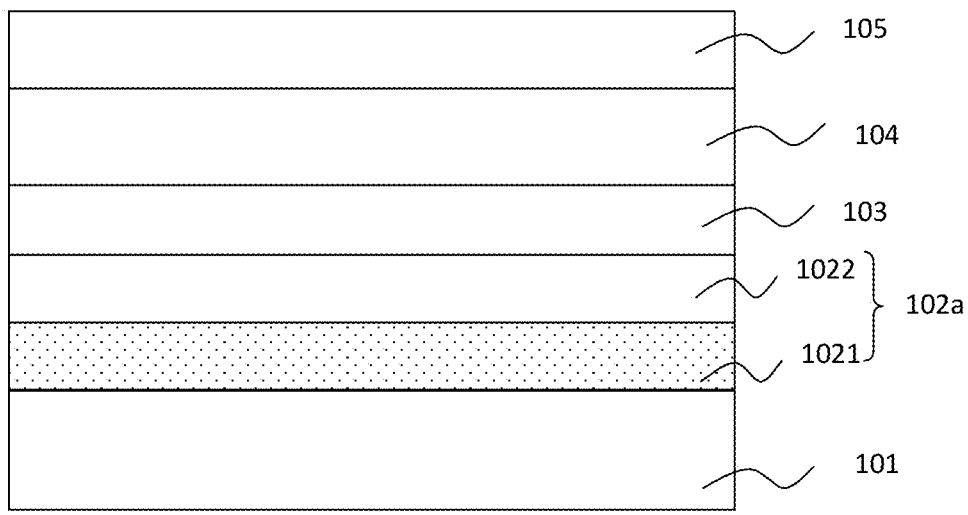
Figure 1F:
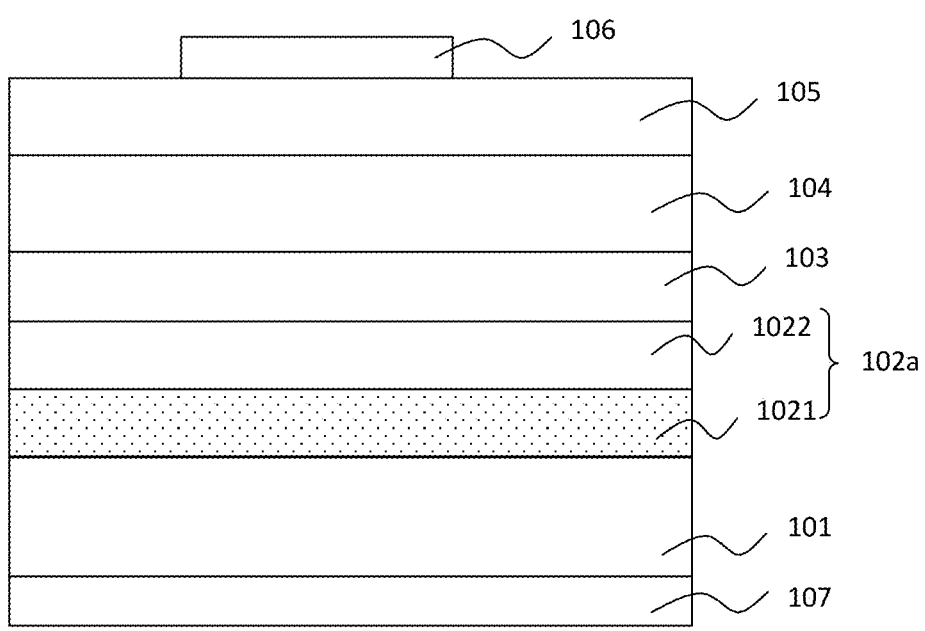

Following, as FIG. 1E shows, a first conductivity semiconductor layer 103, an active layer 104, and a second conductivity semiconductor layer 105 are formed on the second transition layer 1022 subsequently. Finally, as shown in FIG. 1F, two electrodes 106, 107 are formed on the second conductivity semiconductor layer 105 and the substrate 101 respectively to form a vertical type optoelectronic device 100.

Figure 1G:
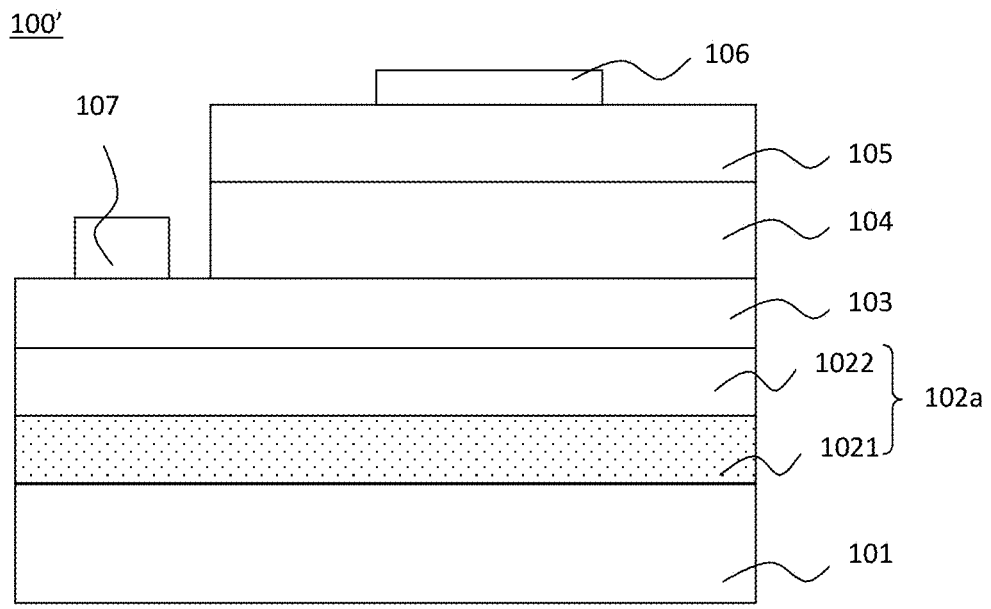

In one embodiment, as shown in FIG. 1G, partial of the active layer 104 and the second conductivity semiconductor layer 105 is etched to expose partial of the first conductivity semiconductor layer 103. Two electrodes 106, 107 are formed on the second conductivity semiconductor layer 105 and the first conductivity semiconductor layer 103 respectively to form a horizontal type optoelectronic device 100'. The material of the electrode 106, 107 can be Cr, Ti, Ni, Pt, Cu, Au, Al, or Ag.

In one embodiment, the optoelectronic device 100' can be bonded on a submount to form a flip-chip structure.

Figure 1H:
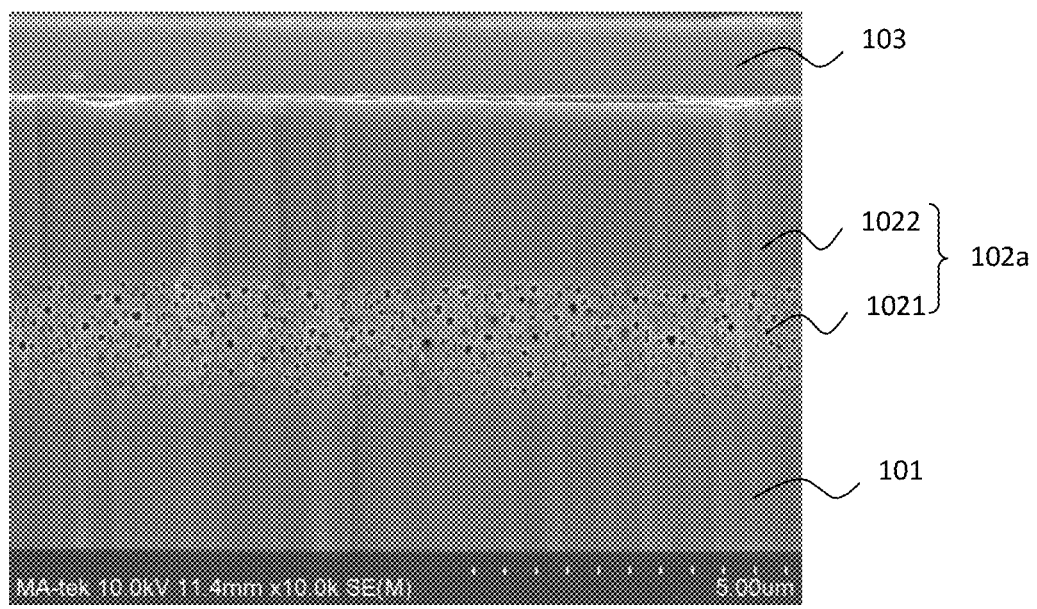

FIG. 1H illustrates a scanning electron microscope (SEM) picture of the first embodiment of the present disclosure which shows the substrate 101, the first transition layer 1021, the second transition layer 1022 and the first conductivity semiconductor layer 103. In one embodiment, the width W of the hollow component inside the first transition layer 1021 is decreased along the direction from the substrate 101 to the second transition layer 1022.

The plurality of the hollow components inside the first transition layer 1021 having a refractive index. Because of the difference of the refractive index of the plurality of the hollow components and the semiconductor layer, for example, the refractive index of the semiconductor layer is 2-3, and the refractive index of air is 1 so the light transmitting into the plurality of the hollow components changes its emitting direction to outside the optoelectronic device and increases the light emitting efficiency. Besides, the plurality of the hollow components can be a scattering center to change the direction of the photon and decrease the total reflection. By increasing the porosity of the hollow component, the effect mentioned above is increasing.

The second transition layer 1022 can be an unintentional doped layer or an undoped layer. The second transition layer 1022 is laterally grown and coalesced on the first transition layer 1021 by decreasing the volume of the hollow component formed between the interfaces of the first transition layer 1021 and the second transition layer 1022 and continues to epitaxial grow vertically. The second transition layer 1022 can avoid the absorption of the doping material such as Si or Mg into the hollow component from the doped n-type or p-type semiconductor layer, and the transmittance and the light extraction efficiency is therefore increased.

FIGS. 2A to 2H illustrate the structure of another optoelectronic device of the second embodiment in the present disclosure.

Figure 2A:
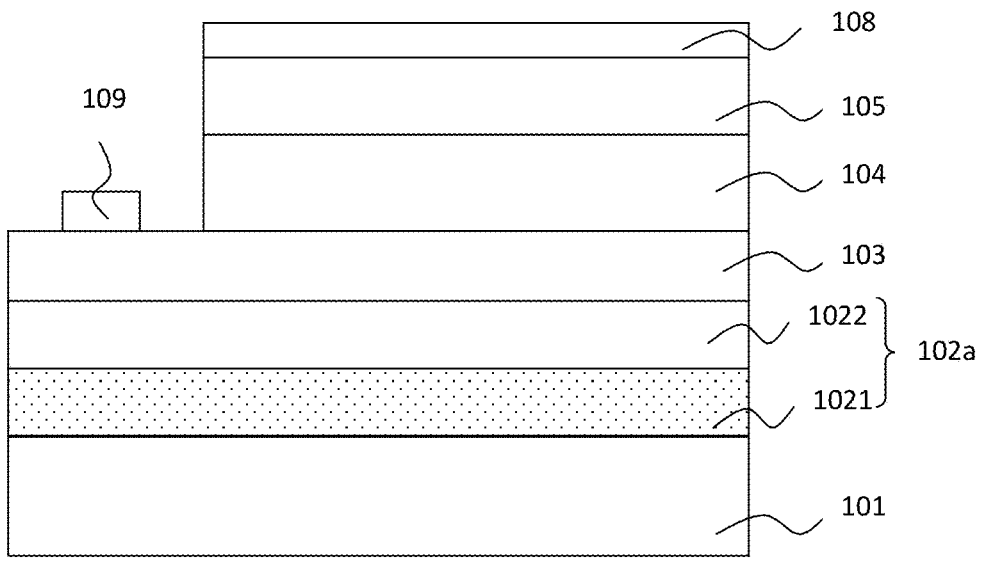
FIGS. 2A to 2H illustrate the structure of another optoelectronic device of the second embodiment in the present disclosure.

As FIG. 2A shows, following the process shown in FIG. 1E, partial of the active layer 104 and the second conductivity semiconductor layer 105 is etched to expose partial of the first conductivity semiconductor layer 103. In this embodiment, the first conductivity semiconductor layer 103 is n-type doped layer and the second conductivity semiconductor layer 105 is p-type doped layer. Following, a second n-type doped layer 108 is formed on the second conductivity semiconductor layer 105, and a passivation layer 109 is formed on partial of the exposed first conductivity semiconductor layer 103. In this embodiment, the material of the second n-type doped layer 108 contains at least one element selected from the group consisting of Al, Ga, In, As, P, and N, such as GaN, AlGaInP or any other suitable materials. In this embodiment, the doping concentration of the first conductivity semiconductor layer 103 and the second n-type doped layer 108 can be 1E15~1E19 cm$^{-3}$, 1E16~1E19 cm$^{-3}$, 1E17~1E19 cm$^{-3}$, 1E18~1E19 cm$^{-3}$, 5×1E18~1E19 cm$^{-3}$, 5×1E17~1E19 cm$^{-3}$, or 5×1E17~1E18 cm$^{-3}$.

Figure 2B:
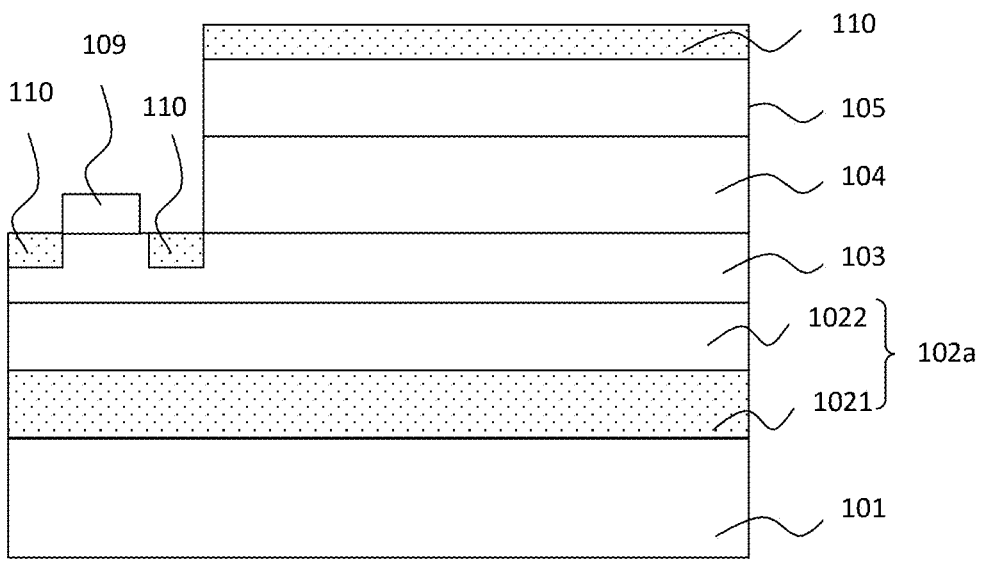

Following, as FIG. 2B shows, the exposed part of the first conductivity semiconductor layer 103 which is not covered by the passivation layer 109 can be etched by the following method to form at least one reflecting layer 110 wherein the reflecting layer 110 includes at least one hollow component such as pore, void, bore, pinhole, cavity, or at least two hollow components that can link into a mesh or porous structure. Besides, the second n-type doped layer 108 can be etched by the following method to form at least one hollow component such as pore, void, bore, pinhole, cavity, or at least two hollow components that can link into a mesh or porous structure. In one embodiment, the partial of the first conductivity semiconductor layer 103 and the second n-type doped layer 108 can be etched at the same time with the same etching condition or can be etched separately.

The etching methods include: 1) Wet etching with an aqueous solution of at least one of $H_2SO_4$, $H_3PO_4$, $H_2C_2O_4$, HCl, KOH, and NaOH, ethylene glycol solution, or their mixture;

2) Electrochemical etching with an aqueous solution of at least one of $H_2SO_4$, $H_3PO_4$, $H_2C_2O_4$, HCl, KOH, and NaOH, an ethylene glycol solution, or their mixture; or 3) Dry etching such as inductive coupling plasma (ICP), reactive ion etch (RIE) by a gas containing at least one of HCl, $Cl_2$, $SF_6$, $H_2$, $BCl_3$, and $CH_4$.

Figure 2C:
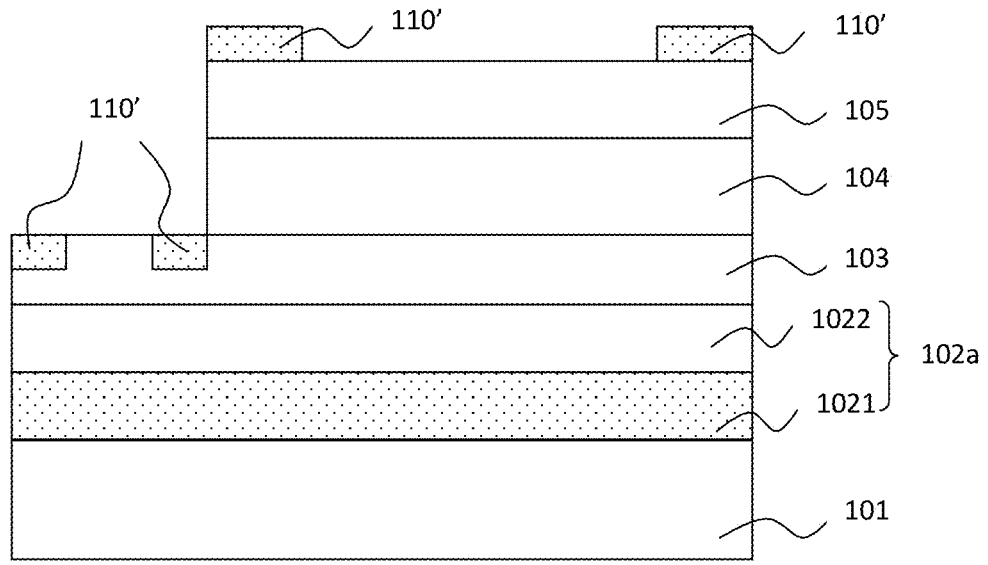

Following, as FIG. 2C shows, the passivation layer 109 is removed. A partial of the reflecting layers 110 is removed to form a plurality of reflecting islands 110'. The plurality of the reflecting islands 110' is generally electrically and thermally conductive, and designed to scatter light toward the substrate 101. The amount of scattering is determined by the thickness and porosity of the plurality of the reflecting islands 110'. The plurality of the reflecting islands 110' generally has a thickness between 0.5 microns and 40 microns. The plurality of the reflecting islands 110' may have porosity as 5%-90%, 10%-90%, 20%-90%, 30%-90%, 40%-90%, 50%-90%, 60%-90%, 70%-90%, or 80%-90%.

A suitable porosity may be related to the thickness of the plurality of the reflecting islands 110'. In order to provide the same amount of scattering, a thicker reflecting island 110' may be less porous than a thinner reflecting island 110'. The light rays reflected and scattered by the plurality of the reflecting islands 110' have a Lambertian radiation pattern with maximum intensity directed perpendicular to surface.

Figure 2D:
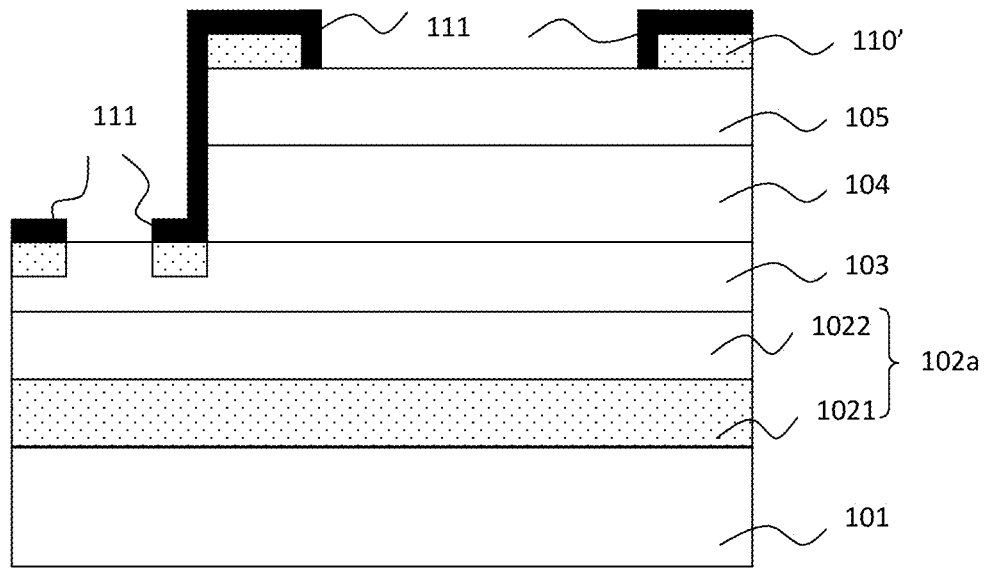
Figure 2E:
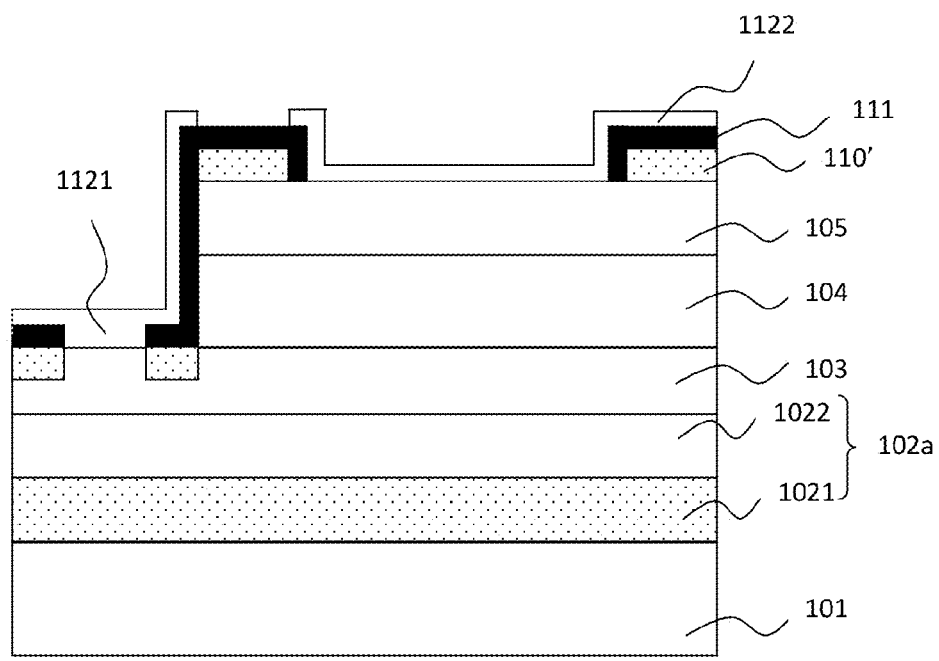

As FIGS. 2D-2E show, a dielectric layer 111 is formed on the plurality of the reflecting islands 110' and the exposed sidewall of the active layer 104 and the second conductivity semiconductor layer 105. Then a first metal reflecting layer 1121 is formed on partial of the dielectric layer 111 and the exposed first conductivity semiconductor layer 103 and the sidewall of the active layer 104 and the second conductivity semiconductor layer 105. A second metal reflecting layer 1122 is formed on partial of the dielectric layer 111 and the exposed second conductivity semiconductor layer 105. The material of the dielectric layer 111 can be single layer or multilayer contains at least one material selected from the group consisting of $SiO_2$, SiNx, $TiO_2$, and $Al_2O_3$. The material of the metal reflecting layer 112 can be single layer or multilayer, and contains at least one element selected from the group consisting of Ag, Al, Rh, Ti, and Pt, or its alloy.

Figure 2F:
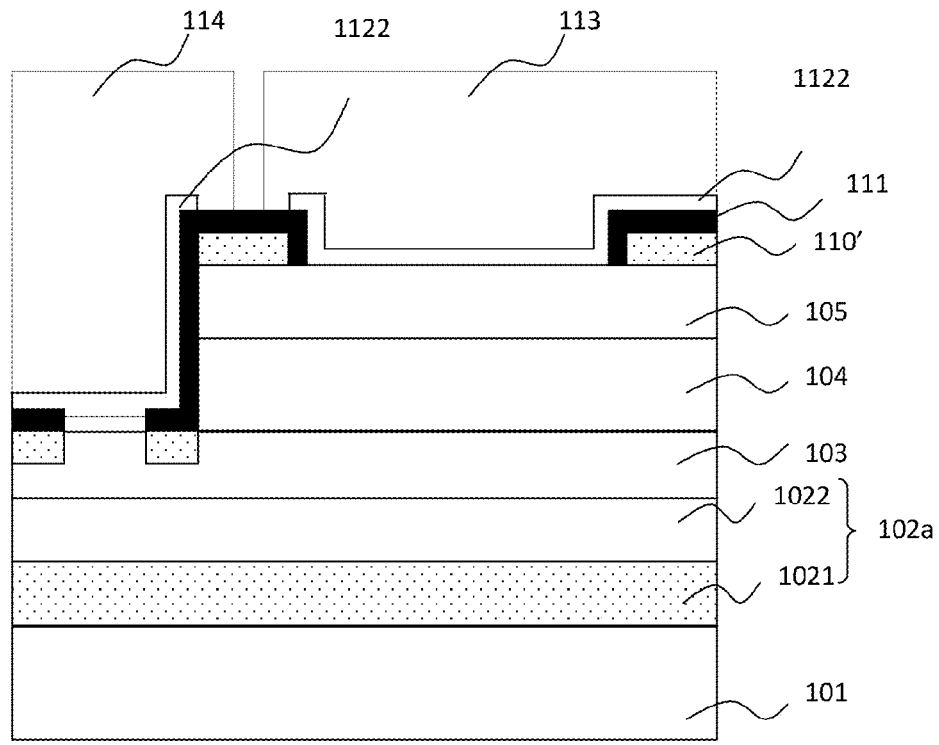

Finally, as FIG. 2F shows, a first contact 114 and a second contact 113 is formed on the first conductivity semiconductor layer 103 and the second conductivity semiconductor layer 105 separately wherein the first contact 114 and the second contact 113 may be electrically isolated by the dielectric layer 111. In one embodiment, the optoelectronic device can then be bonded on a submount to form a flip-chip structure.

Figure 2G:
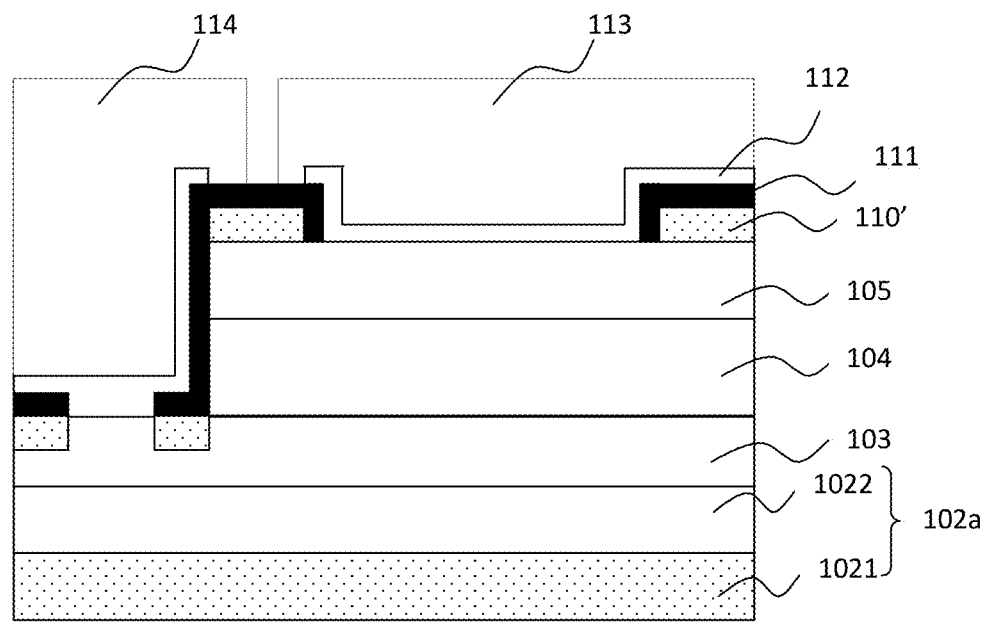

In another embodiment of this application, as FIG. 2G shows, followed by the structure as FIG. 2F, the substrate 101 can be removed by laser lift-off or other method to form a thin-film flip-chip structure.

Figure 2H:
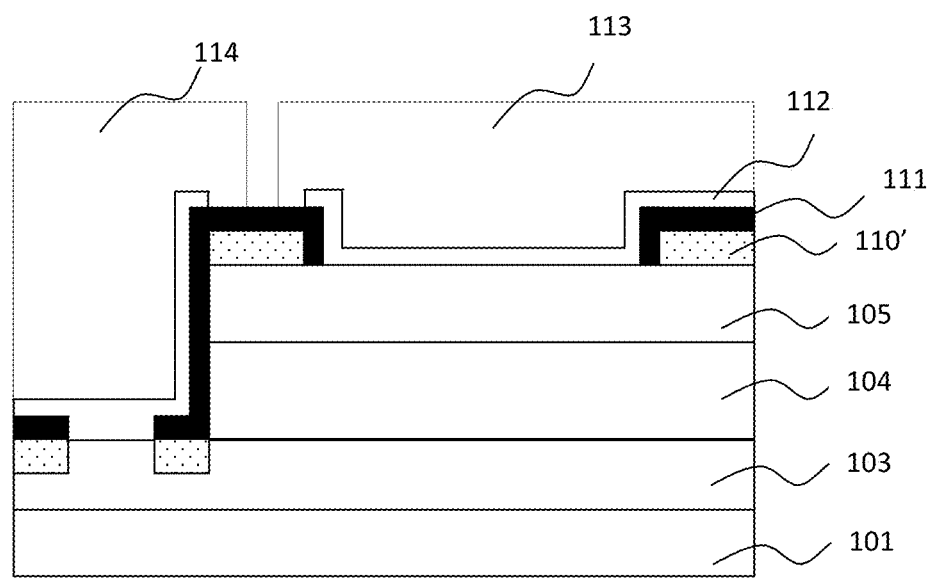

In another embodiment of this application, as FIG. 2H shows, followed by the structure as FIG. 2F, the first transition layer can be omitted during the process.

Figure 3A:
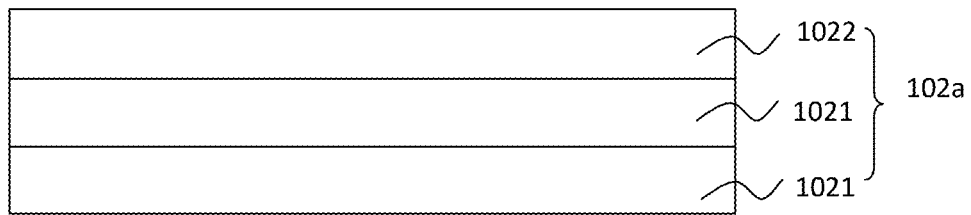
FIGS. 3A to 3C illustrate the structure of another optoelectronic device of the third embodiment in the present disclosure.
Figure 3B:
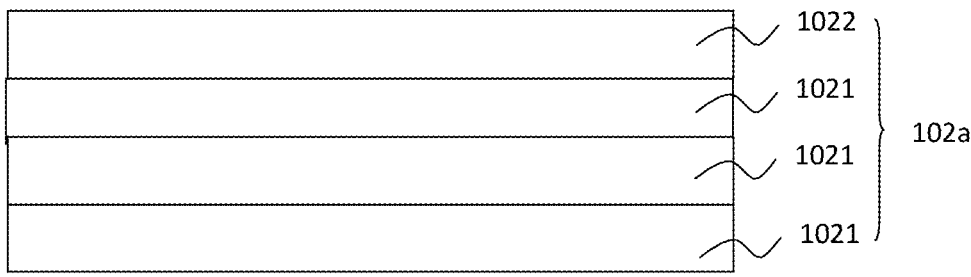
Figure 3C:
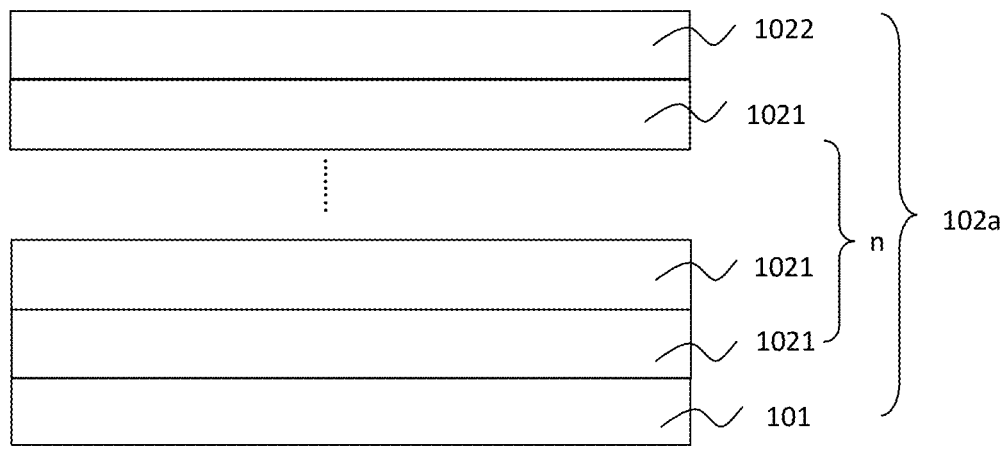

FIGS. 3A to 3C illustrate the structure of another optoelectronic device of the second embodiment in the present disclosure. As FIGS. 3A-3C shows, the first transition stack 102a can include a plurality of the first transition layers 1021 and one second transition layer 1022. As FIG. 3A shows, it can include two layers of the first transition layer 1021 formed on the substrate (no shown), and a layer of the second transition layer 1022 formed on the first transition layer 1021.

As FIG. 3B shows, it can include three layers of the first transition layer 1021 formed on the substrate (no shown) and a layer of the second transition layer 1022 formed on the top surface of the upmost layer of the first transition layer 1021. As FIG. 3C shows, by the actual design of the optoelectronic device, it can include n layers of the first transition layer 1021 formed on the substrate (no shown) and a layer of the second transition layer 1022 formed on the top surface of the upmost layer of the first transition layer 1021 wherein n≧4 to have a better optical effect or decreasing the stress. In this embodiment, each first transition layer 1021 can have the same or different doping concentration which can be 1E15-1E19 $cm^{-3}$, 1E16-1E19 $cm^{-3}$, 1E17-1E19 $cm^{-3}$, 1E18-1E19 $cm^{-3}$, 5×1E18-1E19 $cm^{-3}$, 5×1E17-1E19 $cm^{-3}$, or 5×1E17-1E18 $cm^{-3}$ and can have at least one hollow component such as pore, void, bore, pinhole, cavity, or at least two hollow components that can link into a mesh or porous structure. The fabricating method, material, size or other character is the same with the embodiment mentioned above. In one embodiment, each of the plurality first transition layers has at least one hollow component with different width, and the width of the hollow component closer to the second transition layer is smaller than the width of the hollow component closer to the substrate. In one embodiment, each of the plurality first transition layers has at least one hollow component with different width, and the width of the hollow component is decreasing from the hollow component closer to the second transition layer to the hollow component closer to the substrate.

Figure 4A:
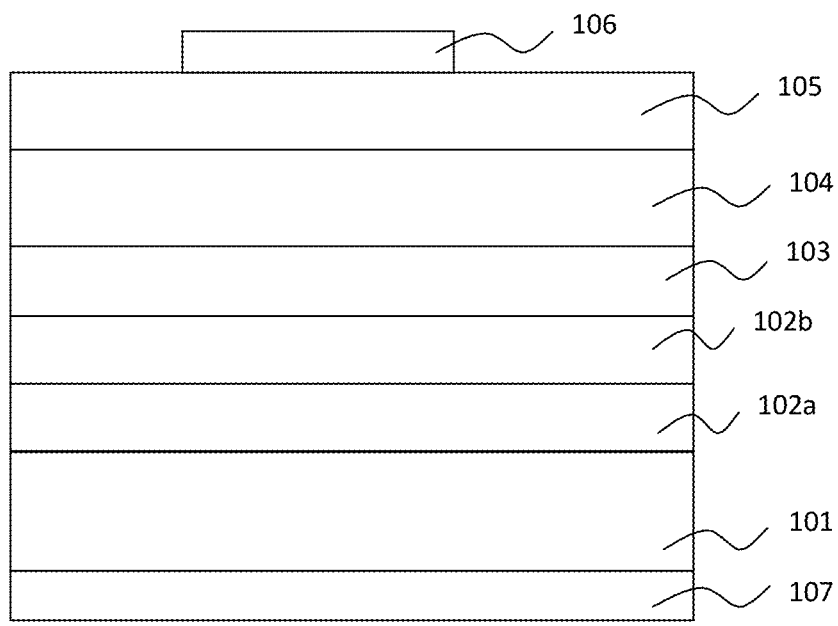
FIGS. 4A to 4C illustrate the structure of another optoelectronic device of the fourth embodiment in the present disclosure.
Figure 4B:
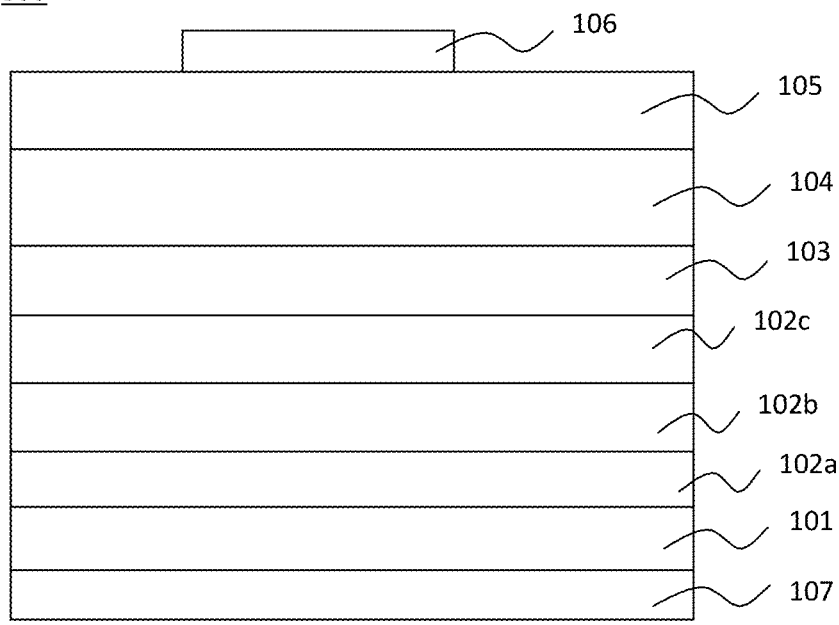
Figure 4C:
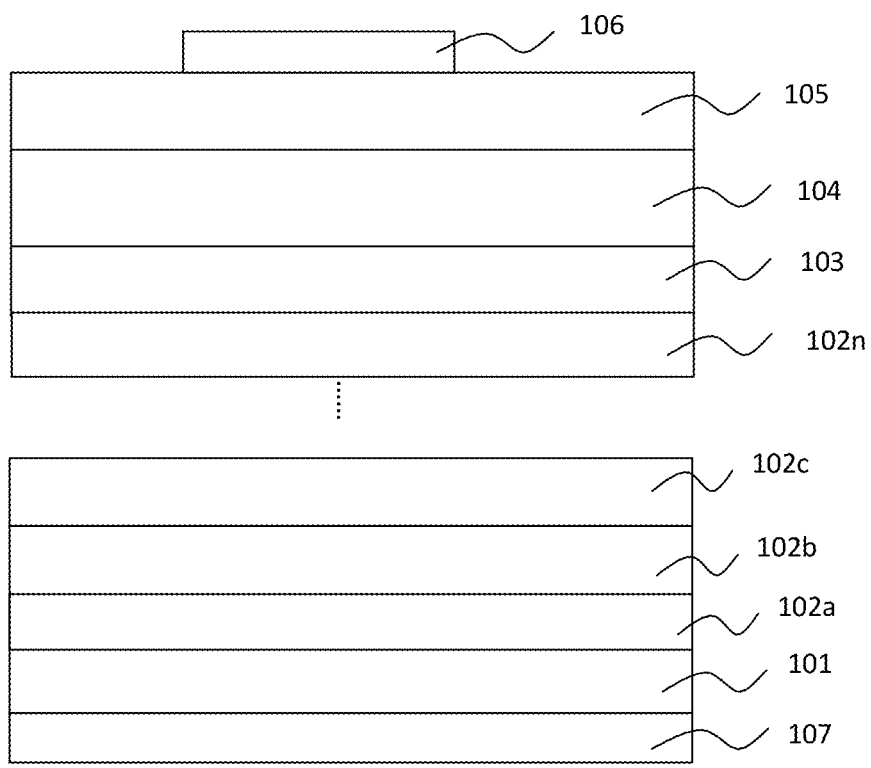
Figure 5A:
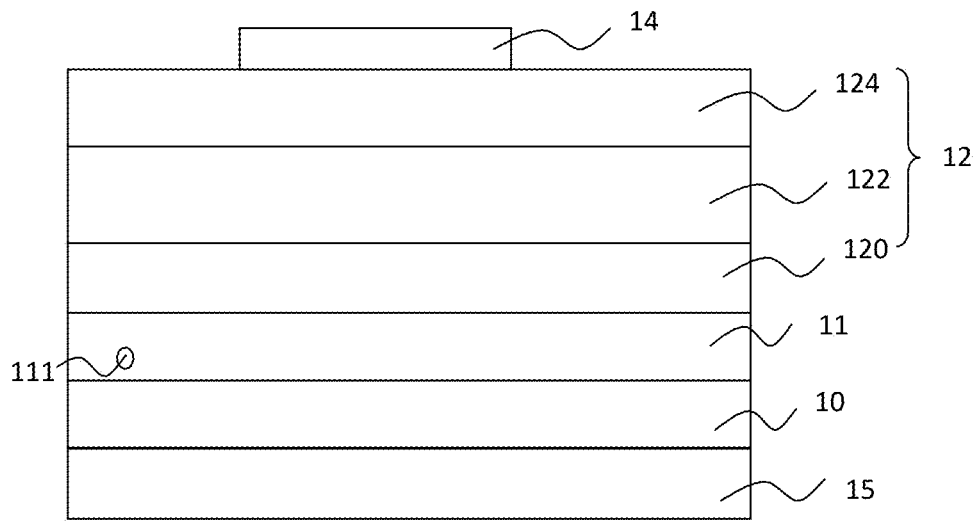
FIG. 5A illustrates the structure of a conventional light emitting device.
Figure 5B:
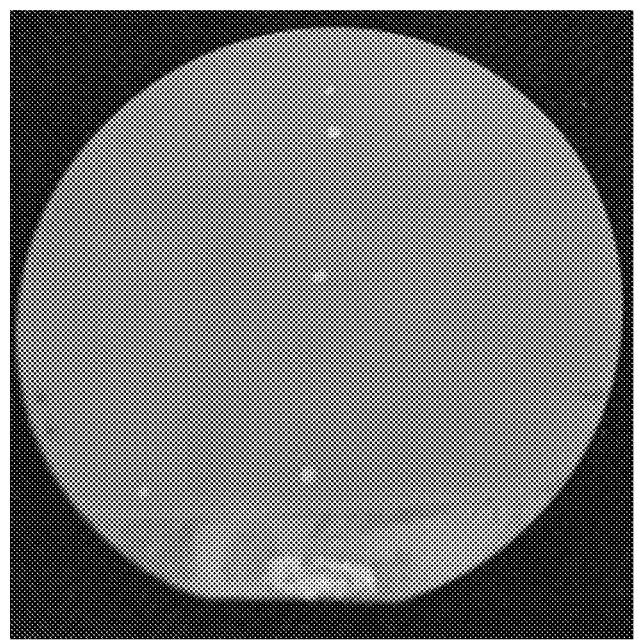
FIG. 5B illustrates the top view structure of the conventional light emitting device.

FIGS. 4A-4C illustrates the structure of another optoelectronic device of another embodiment in the present disclosure. As FIG. 4A shows, in this embodiment of the optoelectronic device 200, a second transition stack 102b can be formed on the first transition stack 102a. In this embodiment, the first transition stack 102a as the other embodiment mentioned above can include at least one layer of the first transition layer (not shown) and one layer of the second transition layer (not shown). And the second transition stack 102b can include at least one layer of the first transition layer (not shown) and one layer of the second transition layer (not shown). In another embodiment, as the other embodiment mentioned above, the first transition stack 102a and the second transition stack 102b can respectively have a plurality of first transition layers (not shown), and each first transition layer 1021 can have at least one hollow component such as pore, void, bore, pinhole, cavity, or at least two hollow components that can link into a mesh or porous structure. The fabricating method, material, size or other character is the same with the embodiment mentioned above.

As FIG. 4B shows, as another embodiment of the optoelectronic device 300, a second transition stack 102b, and a third transition stack 102c can be formed on the first transition stack 102a. In this embodiment, the first transition stack 102a as the other embodiment mentioned above can include at least one layer of the first transition layer (not shown) and one layer of the second transition layer (not shown). The second transition stack 102b can include at least one layer of the first transition layer (not shown) and one layer of the second transition layer (not shown). The third transition stack 102c can include at least one layer of the first transition layer (not shown) and one layer of the second transition layer (not shown). In another embodiment, as the other embodiment mentioned above, the first transition stack 102a can respectively have a plurality of first transition layers (not shown), and each first transition layer 1021 can have at least one hollow component such as pore, void, bore, pinhole, cavity, or at least two hollow components that can link into a mesh or porous structure. The fabricating method, material, size or other character is the same with the embodiment mentioned above.

As FIG. 4C shows, as another embodiment of the optoelectronic device 400, a second transition stack 102b, a third transition stack 102c . . . and a n transition stack 102n can be formed on the first transition stack 102a wherein n≧4. In this embodiment, each of the transition stack as the other embodiment mentioned above can include at least one layer of the first transition layer (not shown) and one layer of the second transition layer (not shown). In another embodiment, as the other embodiment mentioned above, each of the first transition stack can respectively have a plurality of first transition layers (not shown), and each first transition layer 1021 can have at least one hollow component such as pore, void, bore, pinhole, cavity, or at least two hollow components that can link into a mesh or porous structure. The fabricating method, material, size or other character is the same with the embodiment mentioned above.

Specifically speaking, the optoelectronic device 100, 100', 200, 300, and 400 can be a light-emitting diode (LED), a laser diode (LD), a photoresister, an infared emitter, an organic light-emitting diode, a liquid crystal display, or a solar cell, a photo diode.

The material of the substrate 101 used for growing or supporting the first transition stack 102a can be a conductive substrate, a non-conductive substrate, transparent or non-transparent substrate. The material of the conductive substrate can be germanium (Ge), gallium arsenide (GaAs), indium phosphide (InP), silicon carbide (SiC), silicon (Si), lithium aluminium oxide ($LiAlO_2$), zinc oxide (ZnO), gallium nitride (GaN), aluminum nitride (AlN) and metal. The transparent substrate can be sapphire, lithium aluminium oxide ($LiAlO_2$), zinc oxide (ZnO), gallium nitride (GaN), aluminum nitride (AlN), glass, diamond, CVD diamond, diamond-like carbon (DLC), spinel ($MgAl_2O_4$), aluminium oxide ($Al_2O_3$), silicon oxide ($SiO_x$), and Lithium Dioxogallate ($LiGaO_2$).

In accordance with the embodiments in the application, the first conductivity type layer 103 and the second conductivity type layer 105 are two single-layer structures or two multiple layers structure ("multiple layers" means two or more than two layers) having different electrical properties, polarities, dopants for providing electrons or holes respectively. If the first conductivity type layer 103 and the second conductivity type layer 105 are composed of the semiconductor materials, and the conductivity type can be any two of p-type, n-type, and i-type. The active layer 104 disposed between the first conductivity type layer 103 and the second conductivity type layer 105 is a region where the light energy and the electrical energy could transfer or could be induced to transfer. The device transferring the electrical energy to the light energy can be a light-emitting diode, a liquid crystal display, or an organic light-emitting diode; the device transferring the light energy to the electrical energy can be a solar cell or an optoelectronic diode.

In another embodiment of this application, the optoelectronic device 100, 100', 200, 300, 400 is a light emitting device. The light emission spectrum after transformation can be adjusted by changing the physical or chemical arrangement of one layer or more layers in the semiconductor system. The material of the semiconductor layer can be AlGaInP, AlGaInN, or ZnO. The structure of the active layer 104 can be a single heterostructure (SH), a double heterostructure (DH), a double-side double heterostructure (DDH), or a multi-quantum well (MQW). Besides, the wavelength of the emitted light could also be adjusted by changing the number of the pairs of the quantum well for a MQW structure.

In one embodiment of this application, a buffer layer (not shown) could be optionally formed between the substrate 101 and the first transition stack 102a or between the first conductivity layer 103 or the first transition stack 102a. The buffer layer between two material systems can be used as a buffer system. For the structure of the light-emitting diode, the buffer layer is used to reduce the lattice mismatch between two material systems. On the other hand, the buffer layer could also be a single layer, multiple layers, or a structure to combine two materials or two separated structures where the material of the buffer layer can be organic, inorganic, metal, semiconductor and so on, and the function of the buffer layer can be worked as a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure and so on. The material of the buffer layer can be AlN, GaN or other suitable materials. The fabricating method of the buffer layer can be sputter or atomic layer deposition (ALD).

A contact layer (not shown) can also be optionally formed on the second conductivity layer 105. The contact layer is disposed on the side of the second conductivity layer 105 away from the active layer 104. Specifically speaking, the contact layer could be an optical layer, an electrical layer or the combination of the two. An optical layer can change the electromagnetic radiation or the light from or entering the active layer 104. The term "change" here means to change at least one optical property of the electromagnetic radiation or the light. The abovementioned property includes but is not limited to frequency, wavelength, intensity, flux, efficiency, color temperature, rendering index, light field, and angle of view. An electrical layer can change or be induced to change the value, density, or distribution of at least one of the voltage, resistance, current, or capacitance between any pair of the opposite sides of the contact layer. The composition material of the contact layer includes at least one of oxide, conductive oxide, transparent oxide, oxide with 50% or higher transmittance, metal, relatively transparent metal, metal with 50% or higher transmittance, organic material, inorganic material, fluorescent material, phosphorescent material, ceramic, semiconductor, doped semiconductor, and undoped semiconductor. In certain applications, the material of the contact layer is at least one of indium tin oxide (ITO), cadmium tin oxide (CTO), antimony tin oxide, indium zinc oxide, zinc aluminum oxide, and zinc tin oxide. If the material is relatively transparent metal, the thickness is about 0.005 μm~0.6 μm.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. An optoelectronic device comprising:
   a substrate; and
   a first transition stack formed on the substrate comprising at least a first transition layer formed on the substrate having at least a hollow component formed inside the first transition layer, and a second transition layer formed on the first transition layer wherein the second transition layer is an unintentional doped layer or an undoped layer.

2. The optoelectronic device of claim 1, wherein the width of the hollow component can be 10 nm~2000 nm.

3. The optoelectronic device of claim 1, wherein a plurality hollow components is formed inside the first transition structure and at least two hollow components that can link into a mesh or porous structure; or the plurality of the hollow components can be formed as a regular array and the average distance of any two of the hollow components can be 10 nm~2000 nm; and the porosity of the hollow component can be 5-90%.

4. The optoelectronic device of claim 1, further comprising a first conductivity semiconductor layer, an active layer and a second conductivity semiconductor layer formed on the first transition stack wherein the material of the first conductivity semiconductor layer, the active layer, or the second conductivity semiconductor layer contains at least one element selected from the group consisting of Al, Ga, In, As, P, and N.

5. The optoelectronic device of claim 4, further comprising a plurality of reflecting islands formed on partial of the first conductivity semiconductor layer and the second conductivity semiconductor layer wherein the reflecting island comprising at least one hollow component formed inside the reflecting island.

6. The optoelectronic device of claim 1, wherein the width of the hollow component closer to the substrate is larger than the width of the hollow component closer to the second transition layer.

7. The optoelectronic device of claim 1, wherein the first transition stack comprising a plurality of the first transition layers and each of the first transition layers comprising at least one hollow component with different width, and the width of the hollow component closer to the second transition layer is smaller than the width of the hollow component closer to the substrate.

8. The optoelectronic device of claim 1, further comprising a second transition stack formed on the first transition stack wherein the second transition stack comprising at least one first transition layer formed on the first transition stack having at least one hollow component formed inside the first transition layer, and a second transition layer formed on the first transition layer wherein the second transition layer is an unintentional doped layer or an undoped layer.

9. The optoelectronic device of claim 1, wherein the first transition layer is an n-type doping layer with the doping concentration of 1E15-1E19 cm$^{-3}$.

10. A method of fabricating an optoelectronic device, comprising:
    providing a substrate;
    forming a first transition layer on the substrate;
    forming at least a hollow component inside the first transition layer; and
    forming a second transition layer on the on the first transition layer wherein the second transition layer is an unintentional doped layer or an undoped layer.

11. The method of fabricating an optoelectronic device of claim 10, wherein the hollow component formed inside the first transition layer is formed by wet etching, electrochemical etching, or dry etching.

12. The method of fabricating an optoelectronic device of claim 10, wherein the width of the hollow component can be 10 nm-2000 nm.

13. The method of fabricating an optoelectronic device of claim 12, wherein the width of the hollow component closer to the second transition layer is smaller than the width of the hollow component closer to the substrate.

14. The method of fabricating an optoelectronic device of claim 12, wherein the transition stack comprising a plurality of the first transition layers and each of the first transition comprising at least one hollow components with different width, and the width of the hollow component closer to the second transition layer is smaller than the width of the hollow component closer to the substrate.

15. The method of fabricating an optoelectronic device of claim 10, wherein a plurality of the hollow components is formed inside the first transition stack and at least two hollow components that can link into a mesh or porous structure; or the plurality of the hollow components can be formed as a regular array and the average distance any two of the hollow components can be 10 nm-2000 nm; and the porosity of the hollow components can be 5-90%.

16. The method of fabricating an optoelectronic device of claim 10, further comprising a first conductivity semiconductor layer, an active layer, and a second conductivity semiconductor layer formed on the first transition stack wherein the material of the first conductivity semiconductor layer, the active layer or the second conductivity semiconductor layer contains at least one element selected from the group consisting of Al, Ga, In, As, P, and N.

17. The method of fabricating an optoelectronic device of claim 16, further comprising etching partial of the second conductivity semiconductor layer, the active layer, and the exposed part of the first conductivity semiconductor layer, and forming a plurality of reflecting islands on partial of the exposed first conductivity semiconductor layer and the second conductivity semiconductor layer wherein the reflecting island comprising at least one hollow component formed inside the reflecting island.

18. The method of fabricating an optoelectronic device of claim 10, further comprising a plurality of first transition layers of the first transition stack formed between the substrate and the second transition layer.

19. The method of fabricating an optoelectronic device of claim 10, further comprising a second transition stack formed on the first transition stack wherein the second transition stack comprising at least a first transition layer formed on the first transition stack having at least one hollow component formed inside the first transition layer, and a second transition layer formed on the first transition layer wherein the second transition layer is an unintentional doped layer or an undoped layer.

20. The method of fabricating an optoelectronic device of claim 10, wherein the first transition layer is an n-type doping layer with the doping concentration of 1E15-1E19 $cm^{-3}$.

* * * * *